(12) United States Patent
Lu et al.

(10) Patent No.: US 10,615,361 B2
(45) Date of Patent: Apr. 7, 2020

(54) FIELD EFFECT ELECTRODE WITH LAYERED METAL OXIDE

(71) Applicant: Yunnan University, Kunming, Yunnan Province (CN)

(72) Inventors: Zhenghong Lu, Kunming (CN); Tao Zhang, Kunming (CN); Dengke Wang, Kunming (CN)

(73) Assignee: Yunnan University, Kunming (CN)

( * ) Notice: Subject to any disclaimer, the term of this patent is extended or adjusted under 35 U.S.C. 154(b) by 0 days.

(21) Appl. No.: 16/159,455

(22) Filed: Oct. 12, 2018

(65) Prior Publication Data

US 2020/0006695 A1    Jan. 2, 2020

(30) Foreign Application Priority Data

Jun. 29, 2018 (CN) .......................... 2018 1 0695140

(51) Int. Cl.
*H01L 29/08* (2006.01)
*H01L 51/52* (2006.01)
*H01L 51/00* (2006.01)

(52) U.S. Cl.
CPC ...... *H01L 51/5206* (2013.01); *H01L 51/0096* (2013.01); *H01L 2251/303* (2013.01)

(58) Field of Classification Search
CPC .................. H01L 51/5206; H01L 51/0096
USPC .............................................. 257/40
See application file for complete search history.

(56) References Cited

U.S. PATENT DOCUMENTS

2010/0301320 A1* 12/2010 Rand ...................... B82Y 10/00
257/40

* cited by examiner

*Primary Examiner* — Caleb E Henry
(74) *Attorney, Agent, or Firm* — Garvey, Smith & Nehrbass, Patent Attorneys, L.L.C.; Vanessa M. D'Souza; Seth M. Nehrbass

(57) ABSTRACT

A layered metal oxide field effect electrode includes multiple metal strips and layered metal oxide films. The band gap width of the first thin metal oxide film material is less than 3 eV; the band gap width of the second thin metal oxide film material is greater than 3 eV; the band gap width of the third thin metal oxide film material is less than 3 eV; the difference between the band gap width of the second thin metal oxide film material and the band gap width of the first thin metal oxide film material is greater than 1 eV; the difference between the band gap width of the second thin metal oxide film material and the band gap width of the third thin metal oxide film material is greater than 1 eV; and the thicknesses of the first thin metal oxide film, the second thin metal oxide film, and the third thin metal oxide film are each smaller than or equal to 10 nm. The layered metal oxide field effect electrode has the advantages of high light transmittance and a good field conduction performance.

13 Claims, 3 Drawing Sheets

FIELD EFFECT ELECTRODE WITH LAYERED METAL OXIDE

This application claims priority to Chinese patent application number 201810695140.3, filed on Jun. 29, 2018, entitled "LAYERED METAL OXIDE FIELD EFFECT ELECTRODE", which is incorporated herein by reference in its entirety.

TECHNICAL FIELD

The present invention relates to the field of semiconductor display technology, and in particular to a layered metal oxide field effect electrode.

BACKGROUND

The organic light-emitting diode (OLED) is also known as an organic electro-laser display, or an organic light-emitting semiconductor. The OLED display technology adopts a very thin organic material coating and a glass substrate, where when current passes through the glass substrate, the organic material glows, and the OLED display technology is widely applied in mobile phones, digital video cameras, notebook computers and televisions. The basic structure of an OLED device is to sandwich an entire structural layer between two electrodes to form a sandwich structure, and the entire structural layer includes: a hole transport layer (HTL), an emitting layer (EML) and an electron transport layer (ETL). For selection of an anode material, the material itself must have a high work function and light transmissivity, and an indium tin oxide (ITO) transparent conductive film having a high work function of 4.5 eV to 5.3 eV, stable properties and high light transmittance is widely used in an anode. However, indium, which is one of the elements constituting ITO, is a scarce metal with a low global reserve, and the production of ITO requires expensive equipment. Therefore, it is necessary to find a transparent electrode material which can replace ITO.

The transparent conductive electrode needs to have a low sheet resistance (about 100 $\Omega/cm^2$), have a high carrier concentration (about $10^{20}/cm^3$), and have a high light transmittance (for the visible light at 550 nm, the transmission rate >85%). At present, a material which can be used as the transparent conductive electrode includes a thin metal film, a thin oxide film, or a thin polymer film. The thickness of the thin conductive transparent metal film needs to be controlled between 3-15 nm to ensure a high light transmittance of the transparent electrode. However, due to a metal surface effect and impurities, when a thin metal film having a thickness less than 10 nm is actually prepared, an island-like structure is easily formed to remarkably improve the resistivity of the thin film, and the undulating island structure causes scattering of an incident light, thereby affecting the transmittance of the thin film. The metal which is commonly used as a thin transparent metal film includes Ag, Au, Cu, Al, Cr, etc. Although having the advantage of low electrical resistance, a pure metal, when used as the thin transparent conductive film, has the disadvantages of being readily oxidizable, having insufficient light transmission, having no flexibility, and having a poor mechanical strength. In order to change the disadvantage of the thin metal film of having poor mechanical properties, thin metal-mesh films, thin nanowire mesh films, and the like thin films are used as the thin transparent conductive films, but it is required to introduce a precursor and conditions such as a high temperature in the preparation of the thin metal-mesh films and the thin nanowire films, leading to a high cost in industrial applications, and thus the thin metal-mesh films and the thin nanowire films cannot be generally commercialized. The thin metal oxide film is the thin transparent conductive film commonly used in the industry field because of its advantages of easy preparation, good light transmittance, and various types. Common thin transparent metal oxide films include $SnO_2$, $ZnO$, $In_2O_3$, $GaO$, $Cu_2O$, $Zn_2SnO_4$, $ZnSnO_3$, $MgIn_2O_4$, $GaInO_3$, $(GaIn)_2O_3$, $Zn_2In_2O_5$, $In_4Sn_3O_{12}$, and $Cd_2SnO_4$, doped systems developed on the basis of the thin metal oxide film include $SnO_2$:Sb, $SnO_2$:F, and $In_2O_3$:Sn, and the photoelectric and mechanical properties of the conductive thin film are changed by changing the doped components. However, due to the poor mechanical properties of the metal oxide, the thin metal oxide film cannot be applied to a device such as a flexible thin film solar cell, a flexible touch screen display, and an electronic skin, and has a non-ideal effect in terms of improving the light transmittance while enhancing conductive properties.

SUMMARY

An object of the present invention provides a layered metal oxide field effect electrode with high light transmittance and good conductive properties.

In order to achieve the above object, the present invention provides the following technical solutions:

a layered metal oxide field effect electrode includes:

multiple metal strips and thin layered metal oxide films;

The thin layered metal oxide films include a first thin metal oxide film, a second thin metal oxide film, and a third thin metal oxide film;

The lower surface of the second thin metal oxide film is disposed on the upper surface of the first thin metal oxide film; the lower surface of the third thin metal oxide film is disposed on the upper surface of the second thin metal oxide film; the multiple metal strips are arranged on the lower surface of the first thin metal oxide film; and there is a gap between two adjacent ones of the metal strips.

The band gap (sometimes referred to as the "forbidden band") width of the first thin metal oxide film material is less than 3 eV; the band gap width of the second thin metal oxide film material is greater than 3 eV; the band gap width of the third thin metal oxide film material is less than 3 eV; the difference between the band gap width of the second thin metal oxide film material and the band gap width of the first thin metal oxide film material is greater than 1 eV; and the difference between the band gap width of the second thin metal oxide film material and the band gap width of the third thin metal oxide film material is greater than 1 eV.

The thicknesses of the first thin metal oxide film, the second thin metal oxide film, and the third thin metal oxide film are each smaller than or equal to 10 nm.

Optionally, the layered metal oxide field effect electrode further includes a substrate, and the multiple metal strips are disposed on the substrate.

Optionally, the substrate is a transparent substrate.

Optionally, the material of the first thin metal oxide film is $MoO_2$.

Optionally, the material of the first thin metal oxide film is one of $Bi_2MoO$, $Bi_2O_3$, $BiVO_4$, $Ce_2O_3$, $CoTiO_3$, $Cr_2O_3$, $CuO$, $Cu_2O$, $FeO$, $Fe_2O_3$, $Fe_3O_4$, $HgO$, $Hg_2Nb_2O_7$, $In_2O_3$, $MgIn_2O_4$, $NiO$, $NiTiO_3$, $PbFe_{12}O_1$, $PbO$, $Tl_2O_3$, $VO$, $VO_2$, $V_2O_5$, $WO$, $WO_2$, $WO_3$, and $YFeO_3$.

Optionally, the material of the second thin metal oxide film is $Al_2O_3$.

Optionally, the material of the second thin metal oxide thin film is one of CaO, GeO$_2$, HfO$_2$, La$_2$O$_3$, MgO, SiO$_2$, SrO, SnO$_2$, SnO, Ta$_2$O$_5$, TiO$_2$, ZnO, and ZrO$_2$.

Optionally, the material of the second thin metal oxide film is one of AlTiO, AlTiO$_3$, BaTiO$_3$, CaTiO$_3$, CuAlO$_2$, CuGaO$_2$, CuSrO$_2$, LiTaO$_3$, LaTi$_2$O$_7$, LiNbO$_3$, PbZrO$_3$, PbTiO$_3$, PrAlO, SrTiO$_3$, Zn$_2$SnO$_4$, and ZnTiO$_3$.

Optionally, the material of the third thin metal oxide film is MoO$_2$.

Optionally, the material of the third thin metal oxide film is one of Bi$_2$MoO, Bi$_2$O$_3$, BiVO$_4$, Ce$_2$O$_3$, CoTiO$_3$, Cr$_2$O$_3$, CuO, Cu$_2$O, FeO, Fe$_2$O$_3$, Fe$_3$O$_4$, HgO, Hg$_2$Nb$_2$O$_7$, In$_2$O$_3$, MgIn$_2$O$_4$, MoO$_3$, NiTiO$_3$, NiO, PbO, PbFe$_{12}$O$_1$, Tl$_2$O$_3$, VO, VO$_2$, V$_2$O$_5$, WO, WO$_2$, WO$_3$, and YFeO$_3$.

Optionally, the material of the substrate is one of glass, quartz glass, sapphire, BN, CaF$_2$, GaN, LaAlO$_3$, LiF, LiNbO$_3$, LiTaO$_3$, and MgF$_2$.

Optionally, the material of the substrate is one of polyethylene terephthalate, poly(diethyl phthalate), polyether sulfone, and polyimide.

Optionally, the material of the metal strip is Al.

Optionally, the material of the metal strip is Ag, Au, Cu, Fe, Mo, Ni, Pt, W, Zn, or two or more alloys thereof.

Optionally, the layered metal oxide field effect electrode is applied to the anode of the OLED device.

Compared with the prior art, the beneficial effects of the present invention are:

The present invention provides a layered metal oxide field effect electrode, which includes multiple metal strips and thin layered metal oxide films, and has a simple structure. The thin layered metal oxide films include a first thin metal oxide film, a second thin metal oxide film, and a third thin metal oxide film. The band gap width of the first thin metal oxide film material is less than 3 eV; the band gap width of the second thin metal oxide film material is greater than 3 eV; the band gap width of the third thin metal oxide film material is less than 3 eV; the difference between the band gap width of the second thin metal oxide film material and the band gap width of the first thin metal oxide film material is greater than 1 eV; and the difference between the band gap width of the second thin metal oxide film material and the band gap width of the third thin metal oxide film material is greater than 1 eV. The thin layered metal oxide film has a carrier mobility larger than $10^3$ cm$^2$/Vs when an external electric field is applied, and the field conduction property is good. By setting the thicknesses of the first thin metal oxide film, the second thin metal oxide film, and the third thin metal oxide film in the range of 10 nm, it is ensured that the layered metal oxide field effect electrode has the advantage of high light transmittance.

Additionally, the present invention can also provide multiple metal strips on a transparent substrate, which can be applied to the field of flexible display technology by changing the material of the substrate.

BRIEF DESCRIPTION OF THE DRAWINGS

In order to more clearly illustrate embodiments of the present invention or the technical solutions in the prior art, the drawings required to be used in embodiments will be briefly described below. Obviously, the drawings in the following description are only some embodiments of the present invention. For those of ordinary skills in the art, other drawings may also be obtained based on these drawings without creative labor.

DETAILED DESCRIPTION

The technical solutions in embodiments of the present invention will be clearly and completely described here after in connection with the accompanying drawings in embodiments of the present invention. Obviously, the described embodiments are only part of the embodiments of the present invention, not all of the embodiments. Based on embodiments of the present invention, all other embodiments obtained by those of ordinary skills in the field without creative labor fall into the claimed scope of the present invention.

The object of the present invention is to provide a layered metal oxide field effect electrode with high light transmittance and good electrical conductivity.

In order to make the above purpose, characteristics and advantages of the present invention more apparent, the present invention is further described in detail in connection with the accompanying drawings and specific embodiments.

Example 1

Figure 1:
FIG. 1 is a schematic structure view of the layered metal oxide field effect electrode according to Example 1 of the present invention.

FIG. 1 is a schematic structure view of the layered metal oxide field effect electrode of the present invention. As shown in FIG. 1, the layered metal oxide field effect electrode provided by the present invention includes: multiple metal strips 110 and thin layered metal oxide films.

The thin layered metal oxide films include a first thin metal oxide film 111, a second thin metal oxide film 112, and a third thin metal oxide film 113.

The lower surface of the second thin metal oxide film 112 is disposed on the upper surface of the first thin metal oxide film 111, and the lower surface 113 of the third thin metal oxide film is disposed on the upper surface of the second thin metal oxide film 112; the multiple metal strips are arranged on the lower surface of the first thin metal oxide film 111; and there is a gap between two adjacent ones of the metal strips 110.

The material of the first thin metal oxide film is MoO$_2$ with a band gap width of 0.5-1.0 eV, and the thickness of the thin MoO$_2$ film is 2 nm; the material of the second thin metal oxide film is Al$_2$O$_3$ with a band gap width of 7 eV, and the thickness of the thin $Al_2O_3$ film is 2 nm; and the material of the third thin metal oxide film is $MoO_2$ with a band gap width of 0.5-1.0 eV, and the thickness of the thin $MoO_2$ film is 3 nm.

The material of the metal strip is aluminum, the thickness of the metal strip is 100 nm, the width of the metal strip is smaller than or equal to 100 nm; and the gap between two adjacent metal strips is smaller than or equal to 1 mm.

The material of the first thin metal oxide film of the layered metal oxide field effect electrode may also be one of $Bi_2MoO$, $Bi_2O_3$, $BiVO_4$, $Ce_2O_3$, $CoTiO_3$, $Cr_2O_3$, $CuO$, $Cu_2O$, $FeO$, $Fe_2O_3$, $Fe_3O_4$, $HgO$, $Hg_2Nb_2O_7$, $In_2O_3$, $MgIn_2O_4$, $NiO$, $NiTiO_3$, $PbFe_{12}O_1$, $PbO$, $Tl_2O_3$, $VO$, $VO_2$, $V_2O_5$, $WO$, $WO_2$, $WO_3$, and $YFeO_3$.

The material of the second thin metal oxide film material may also be one of $CaO$, $GeO_2$, $HfO_2$, $La_2O_3$, $MgO$, $SiO_2$, $SrO$, $SnO_2$, $SnO$, $Ta_2O_5$, $TiO_2$, $ZnO$, or $ZrO_2$.

The material of the second thin metal oxide film may also be one of $AlTiO$, $AlTiO_3$, $BaTiO_3$, $CaTiO_3$, $CuAlO_2$, $CuGaO_2$, $CuSrO_2$, $LiTaO_3$, $LaTi_2O_7$, $LiNbO_3$, $PbZrO_3$, $PbTiO_3$, $PrAlO$, $SrTiO_3$, $Zn_2SnO_4$, $ZnTiO_3$, an aluminum hafnium oxide, and a silicon hafnium oxide.

The material of the third thin metal oxide film may also be one of $Bi_2MoO$, $Bi_2O_3$, $BiVO_4$, $Ce_2O_3$, $CoTiO_3$, $Cr_2O_3$, $CuO$, $Cu_2O$, $FeO$, $Fe_2O_3$, $Fe_3O_4$, $HgO$, $Hg_2Nb_2O_7$, $In_2O_3$, $MgIn_2O_4$, $MoO_3$, $NiTiO_3$, $NiO$, $PbO$, $PbFe_{12}O_1$, $Tl_2O_3$, $VO$, $VO_2$, $V_2O_5$, $WO$, $WO_2$, $WO_3$, and $YFeO_3$.

The material of the metal strip may also be Ag, Au, Cu, Fe, Mo, Ni, Pt, W, Zn, or two or more alloys thereof.

Example 2

Figure 2:
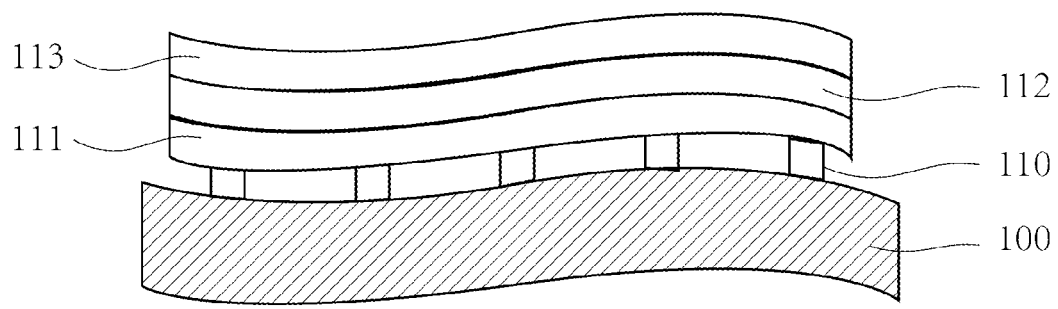
FIG. 2 is a schematic structural view of the layered metal oxide field effect electrode according to Example 2 of the present invention.

FIG. 2 is a schematic structural view of the layered metal oxide field effect electrode of Example 2 of the present invention. As shown in FIG. 2, the difference between this Example and the Example 1 is that: the layered metal oxide field effect electrode further includes a substrate 100, and multiple metal strips 110 disposed on the substrate 100. The material of the substrate is polyethylene terephthalate, and the substrate has a size of 50*50 mm² and a thickness of 1.1 mm.

The material of the substrate can also be one of glass, quartz glass, sapphire, BN, Ca $F_2$, GaN, $LaAlO_3$, LiF, $LiNbO_3$, $LiTaO_3$, and $MgF_2$.

The material of the substrate may also be one of poly (diethyl phthalate), polyether sulfone, and polyimide.

Example 3

Figure 3:
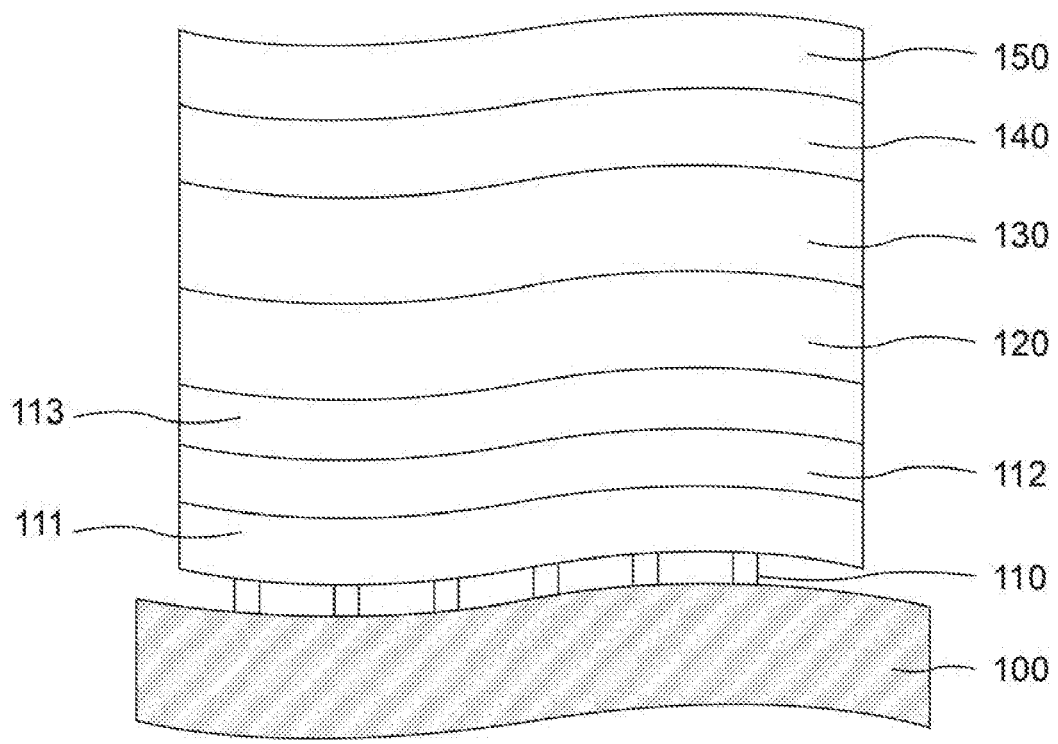
FIG. 3 is a schematic structural view of the OLED device according to Example 3 of the present invention.

FIG. 3 is a schematic structural view of the OLED device of embodiments of the present invention. As shown in FIG. 3, the difference between this Example and Example 1 is that: the OLED device includes a layered metal oxide field effect electrode, a hole injection/transport layer 120, an organic light-emitting layer 130, an electron injection/transport layer 140, and a metal cathode 150. The hole injection/transport layer represents a stacked layer formed by the hole injection layer and the hole transport layer. The lower surface of the hole transport layer is disposed on the upper surface of the hole injection layer. The lower surface of the hole injection/transport layer 120 is disposed on the upper surface of the third thin metal oxide film 113 of the layered metal oxide field effect electrode. The lower surface of the organic light-emitting layer 130 is disposed on the upper surface of the hole injection/transport layer 120. The lower surface of the electron injection/transport layer 140 is disposed on the upper surface of the organic light-emitting layer 130. The lower surface of the metal cathode 150 is disposed on the upper surface of the electron injection/transport layer 140.

The material of the hole injection/transport layer is CPB with the thickness of 20 nm; the organic light-emitting layer is a phosphorescent light-emitting layer formed by doping the CPB and $Ir(ppy)_2(acac)$, where (the quality of $Ir(ppy)_2(acac)$/(the quality of CPB+the quality of $Ir(ppy)_2(acac)$))× 100%=8 wt %, and the thickness of the organic light-emitting layer is 30 nm; the material of the electron injection/transport layer is TPBi with the thickness of 65 nm; and the material of the metal cathode is LiF/Al with the thickness of 100 nm, LiF/Al represents a stacked layer of LiF and Al, and the lower surface of Al is disposed on the upper surface of LiF.

Figure 4:
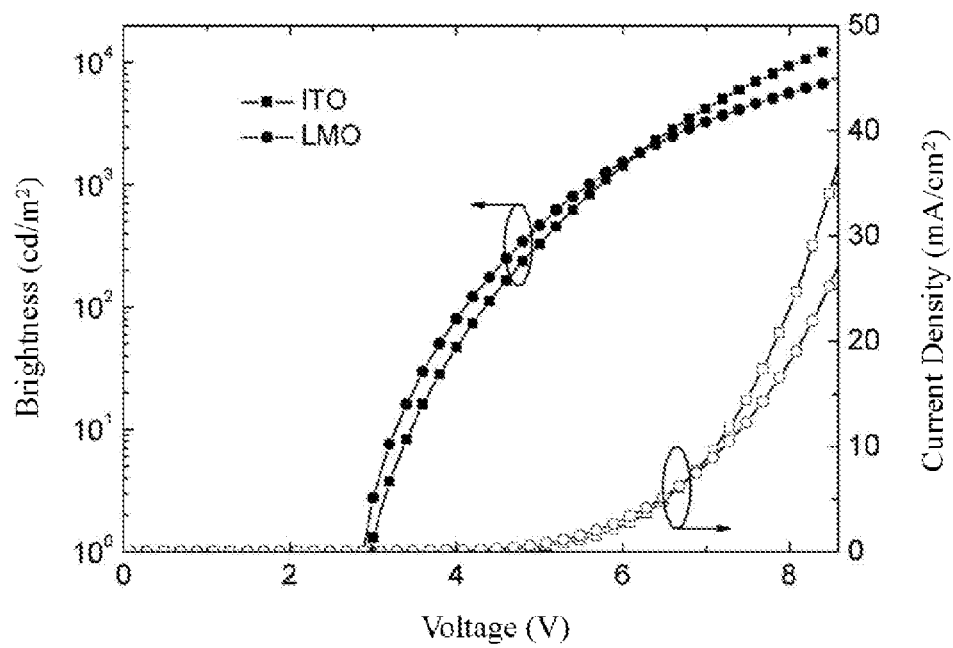
FIG. 4 is a graph showing brightness-voltage-current density of the OLED devices based on the layered metal oxide field effect electrode and the ITO electrode according to Example 3 of the present invention.
Figure 5:
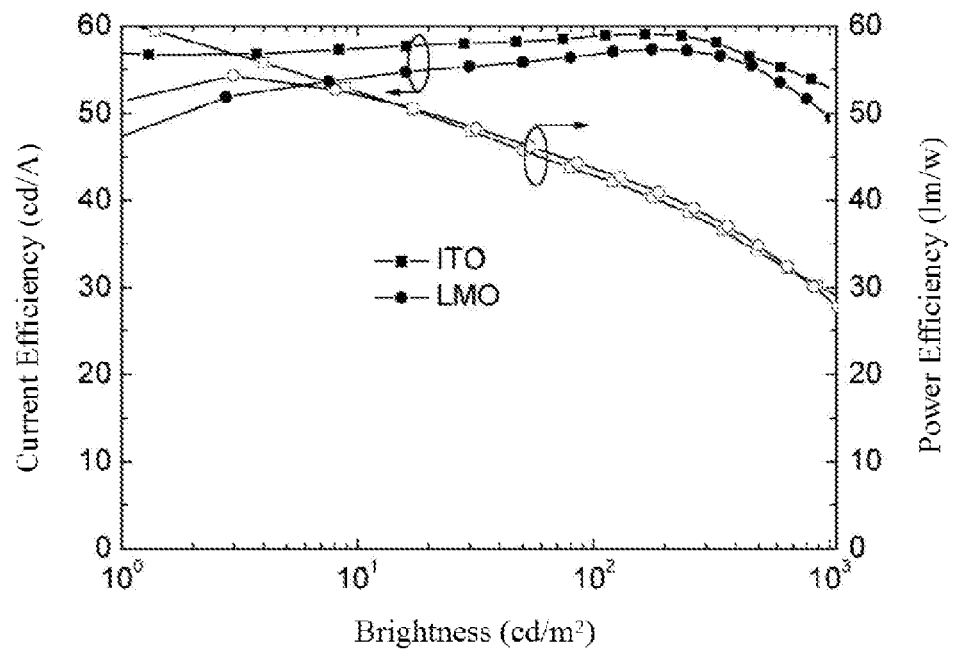
FIG. 5 is a graph showing current efficiency-brightness-power efficiency of the OLED devices based on the layered metal oxide field effect electrode and the ITO electrode according to Example 3 of the present invention.

FIG. 4 is a graph showing brightness-voltage-current density of the OLED devices based on the layered metal oxide field effect electrode and the ITO electrode of embodiments of the present invention. FIG. 5 is a graph showing current efficiency-brightness-power efficiency of the OLED devices based on the layered metal oxide field effect electrode and the ITO electrode of embodiments of the present invention. As shown in FIGS. 4 and 5 (the directions of the circle and the arrow in the figure indicate the physical meaning of the curve), the performance difference between the OLED device based on the layered metal oxide field effect electrode and the OLED device based on the ITO electrode is very small in terms of the current efficiency and the power efficiency, indicating that the layered metal oxide field effect electrode of the present application has advantages of high light transmittance and good conductivity.

Figure 6:
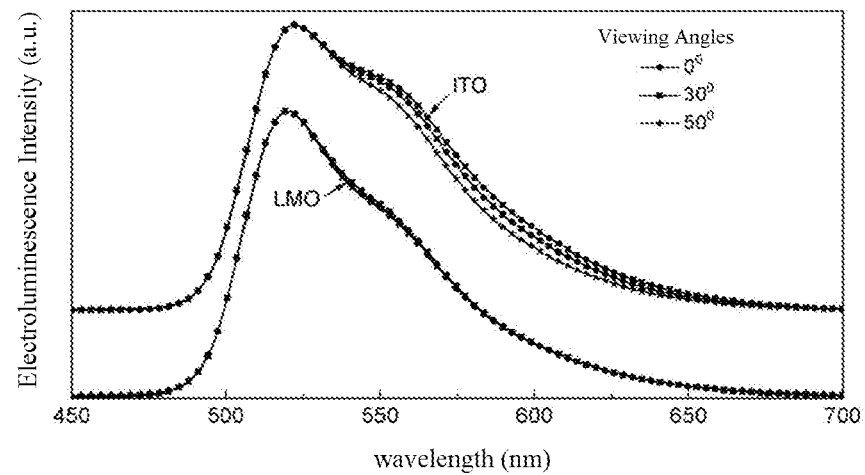
FIG. 6 is a graph showing an emission spectra of the OLED devices based on the layered metal oxide field effect electrode and the ITO electrode at different viewing angles according to the Example 3 of the present invention.

FIG. 6 is a graph showing an electroluminescent spectroscopy of the OLED devices based on the layered metal oxide field effect electrode and the ITO electrode at different viewing angles of embodiments of the present invention. As shown in FIG. 6, the electroluminescent spectrum of the OLED device based on the ITO electrode varies significantly under different observation angles, which indicates that the electroluminescent spectrum of the OLED device based on the ITO electrode is angularly dependent, where since the optical properties of the OLED device depend on the reflectivity of the anode, and the relatively high reflectivity of the ITO electrode results in a strong optical microcavity effect, the electroluminescent spectrum of the OLED device based on the ITO electrode has a relatively strong angular dependence; while the electroluminescent spectrum of the OLED device based on the layered metal oxide field effect electrode does not change substantially under different observation angles.

Figure 7:
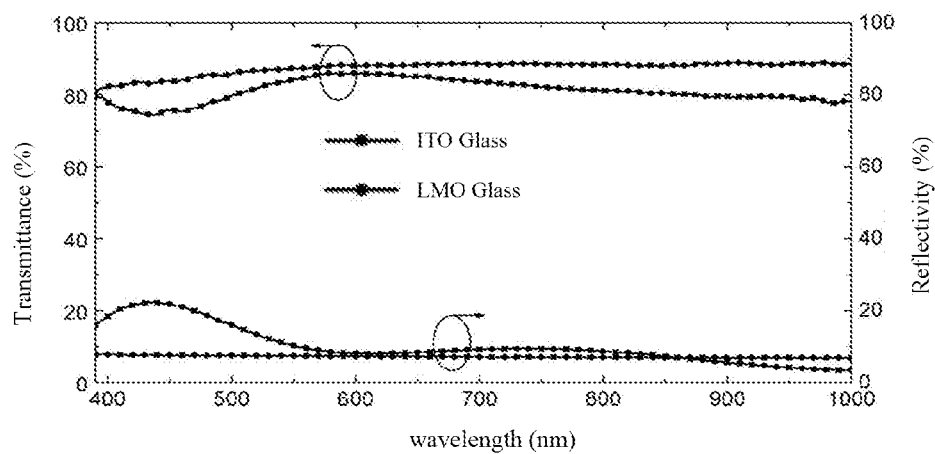
FIG. 7 is a graph showing optical transmittance and reflectance spectra of the ITO glass and the thin layered metal oxide films deposited on an electron white glass according to Example 3 of the present invention.

FIG. 7 is a graph showing optical transmittance and reflectivity of the ITO glass and the layered metal oxide films deposited on an electron white glass of embodiments of the present invention. As shown in FIG. 7 (the directions of the circle and the arrow in the figure indicate the physical meaning of the curve), throughout the entire visible light region, the optical transmittance of the layered metal oxide field effect electrode is higher than that of the ITO electrode, and the reflectivity of the layered metal oxide field effect electrode is lower than that of the ITO electrode. At a wavelength of 520 nm, the transmittance of the ITO glass is 81.8%, and the transmittance of the layered metal oxide field effect electrode deposited on the glass is 86.7%.

PARTS LIST 100 substrate
110 metal strips 111 first thin metal oxide film
112 second thin metal oxide film
113 third thin metal oxide film
120 hole injection/transport layer
130 organic light-emitting layer
140 electron injection/transport layer
150 metal cathode

LISTING OF ACRONYMS AND ABBREVIATIONS

Ag silver
Al mercury
Au gold
B boron
Ba barium
Bi bismuth
Ca calcium
Cd cadmium
Ce cerium
$cm^2$ square centimeters
$cm^3$ cubic centimeters
Co cobalt
CPB 4,4'-Bis(N-carbazolyl)-1,1'-biphenyl
Cr chromium
Cu copper
EML emitting layer
ETL electron transport layer
eV electron volt
F fluorine
Fe iron
Ga gallium
Ge germanium
Hf hafnium
Hg mercury
HTL hole transport layer
In indium
$Ir(ppy)_2(acac)$ $C_{27}H_{23}IrN_2O_2$
ITO indium tin oxide
La lanthanum
Li lithium
Mg magnesium
mm millimeter
$mm^2$ square millimeter
Mo molybdenum
N nitrogen
Nb niobium
Ni nickel
nm nanometer
O oxygen
OLED organic light-emitting diode
Pb lead
Pr praseodymium
Pt platinum
Sb antimony
Si silicon
Sn tin
Sr strontium
Ta tantalum
Ti titanium
Tl thallium
TPBi 2,2',2"-(1,3,5-Benzinetriyl)-tris(1-phenyl-1-H-benzimidazole)
V vanadium
V Volt
W tungsten
wt weight
Y yttrium
Zn zinc
Zr zirconium
$\Omega/cm^2$ resistance The principles and Implementations of the present invention are described herein with reference to specific embodiments. The above description of embodiments is only for helping to understand the method of the present invention and its core ideas; and at the same time, changes can be made in the implementations and the application range by those skilled in the art based on the idea of the present invention. In view of the above, the disclosure of this specification should not be construed as limiting the present invention.

What is claimed is:

1. A field effect electrode with layered metal oxide, comprising:
multiple metal strips and thin layered metal oxide films, wherein the field effect electrode with layered metal oxide further comprises a substrate, and the multiple metal strips are disposed on the substrate;
the thin layered metal oxide films comprise a first thin metal oxide film, a second thin metal oxide film, and a third thin metal oxide film;
the lower surface of the second thin metal oxide film is disposed on the upper surface of the first thin metal oxide film; the lower surface of the third thin metal oxide film is disposed on the upper surface of the second thin metal oxide film; the multiple metal strips are arranged on the lower surface of the first thin metal oxide film; and there is a gap between two adjacent ones of the metal strips;
the band gap width of the first thin metal oxide film material is less than 3 eV; the band gap width of the second thin metal oxide film material is greater than 3 eV; the band gap width of the third thin metal oxide film material is less than 3 eV; the difference between the band gap width of the second thin metal oxide film material and the band gap width of the first thin metal oxide film material is greater than 1 eV; and the difference between the band gap width of the second thin metal oxide film material and the band gap width of the third thin metal oxide film material is greater than 1 eV;
the thicknesses of the first thin metal oxide film, the second thin metal oxide film, and the third thin metal oxide film are each smaller than or equal to 10 nm;
wherein the layered metal oxide field effect electrode is applied to the anode of the OLED device.

2. The field effect electrode with layered metal oxide according to claim 1, wherein the substrate is a transparent substrate.

3. The field effect electrode with layered metal oxide according to claim 1, wherein the material of the first thin metal oxide film is $MoO_2$.

4. The field effect electrode with layered metal oxide according to claim 1, wherein the material of the first thin metal oxide film is one of $Bi_2MoO$, $Bi_2O_3$, $BiVO_4$, $Ce_2O_3$, $CoTiO_3$, $Cr_2O_3$, $CuO$, $Cu_2O$, $FeO$, $Fe_2O_3$, $Fe_3O_4$, $HgO$, $Hg_2Nb_2O_7$, $In_2O_3$, $MgIn_2O_4$, $NiO$, $NiTiO_3$, $PbFe_{12}O_1$, $PbO$, $Tl_2O_3$, $VO$, $VO_2$, $V_2O_5$, $WO$, $WO_2$, $WO_3$, and $YFeO_3$.

5. The field effect electrode with layered metal oxide according to claim 1, wherein the material of the second thin metal oxide film is $Al_2O_3$.

6. The field effect electrode with layered metal oxide according to claim 1, wherein the material of the second metal oxide thin film is one of CaO, $GeO_2$, $HfO_2$, $La_2O_3$, MgO, $SiO_2$, SrO, $SnO_2$, SnO, $Ta_2O_5$, $TiO_2$, ZnO, and $ZrO_2$.

7. The field effect electrode with layered metal oxide according to claim 1, wherein the material of the second thin metal oxide film is one of AlTiO, $AlTiO_3$, $BaTiO_3$, $CaTiO_3$, $CuAlO_2$, $CuGaO_2$, $CuSrO_2$, $LiTaO_3$, $LaTi_2O_7$, $LiNbO_3$, $PbZrO_3$, $PbTiO_3$, PrAlO, $SrTiO_3$, $Zn_2SnO_4$, and $ZnTiO_3$.

8. The field effect electrode with layered metal oxide according to claim 1, wherein the material of the third thin metal oxide film is $MoO_2$.

9. The field effect electrode with layered metal oxide according to claim 1, wherein the material of the third thin metal oxide film is one of $Bi_2MoO$, $Bi_2O_3$, $BiVO_4$, $Ce_2O_3$, $CoTiO_3$, $Cr_2O_3$, CuO, $Cu_2O$, FeO, $Fe_2O_3$, $Fe_3O_4$, HgO, $Hg_2Nb_2O_7$, $In_2O_3$, $MgIn_2O_4$, $MoO_3$, $NiTiO_3$, NiO, PbO, $PbFe_{12}O_1$, $Tl_2O_3$, VO, $VO_2$, $V_2O_5$, WO, $WO_2$, $WO_3$, and $YFeO_3$.

10. The field effect electrode with layered metal oxide according to claim 1, wherein the material of the substrate is one of glass, quartz glass, sapphire, BN, $CaF_2$, GaN, $LaAlO_3$, LiF, $LiNbO_3$, $LiTaO_3$, and $MgF_2$.

11. The field effect electrode with layered metal oxide according to claim 1, wherein the material of the substrate is one of polyethylene terephthalate, poly(diethyl phthalate), polyether sulfone, and polyimide.

12. The field effect electrode with layered metal oxide according to claim 1, wherein the material of the metal strip is Al.

13. The field effect electrode with layered metal oxide according to claim 1, wherein the material of the metal strip is Ag, Au, Cu, Fe, Mo, Ni, Pt, W, Zn, or two or more alloys thereof.

* * * * *